(12) United States Patent
Morikawa

(10) Patent No.: US 8,350,619 B2
(45) Date of Patent: Jan. 8, 2013

(54) FILTER CIRCUIT AND OPTICAL DISK DEVICE INCLUDING THE SAME

(75) Inventor: Hiroyasu Morikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/338,787

(22) Filed: Dec. 28, 2011

(65) Prior Publication Data

US 2012/0098574 A1  Apr. 26, 2012

Related U.S. Application Data

(63) Continuation of application No. PCT/JP2010/004421, filed on Jul. 6, 2010.

(30) Foreign Application Priority Data

Jul. 8, 2009  (JP) .................................. 2009-162007
Feb. 9, 2010  (WO) .................. PCT/JP2010/000798

(51) Int. Cl.
*H03K 5/00* (2006.01)

(52) U.S. Cl. ......................... 327/558; 327/552; 327/337

(58) Field of Classification Search .......... 327/336–337, 327/551–559
See application file for complete search history.

(56) References Cited

U.S. PATENT DOCUMENTS

| 7,049,882 | B2 * | 5/2006 | Pan | ............................... | 327/543 |
| 7,298,221 | B2 * | 11/2007 | Yan | ................................ | 331/17 |
| 2005/0062524 | A1 | 3/2005 | Kato et al. | | |

FOREIGN PATENT DOCUMENTS

| JP | 09-261004 | 10/1997 |
| JP | 2002-299971 | 10/2002 |
| JP | 2005-094091 | 4/2005 |
| WO | WO 98/04038 | 1/1998 |

OTHER PUBLICATIONS

International Search Report issued in International Patent Application No. PCT/JP2010/004421 dated Oct. 12, 2010.
M. Sasaki et al., "A Current Mirror with Controllable Second-Order Low-Pass Function," Technical Report of IEICE ICD, vol. 23, No. 58, pp. 71-77, 1999, with partial English translation thereof.
Sang-Soo Lee et al., "CMOS Continuous-Time Current-Mode Filters for High-Frequency Applications," IEEE Journal of Solid-State Circuits, vol. 28, No. 3, pp. 323-329, Mar. 1993.
M. Sasaki, "A Current Mode Continuous-Time Equalizer with Gain Boost," Technical Report of IEICE ICD, pp. 39-45, Sep. 2001.
Bae, JumHan et al. "A Current Mode Equalizer for an Optical Disc Front-End." IEEE Transactions on Consumer Electronics, vol. 55, No. 2, May 2009. pp. 564-569.

* cited by examiner

*Primary Examiner* — Dinh T. Le

(74) *Attorney, Agent, or Firm* — McDermott Will & Emery LLP

(57) ABSTRACT

A current-mode filter includes a first, a second, and a third transistor having the same channel polarity. The drain of the first transistor is connected to the source of the second transistor functioning as a gate grounded circuit. The drain of the second transistor is connected to the gates of the first and third transistors. A first and a second capacitive element are connected to the gate and drain of the first transistor. The current source supplies a bias current to each of the first and second transistors. The drain of the first transistor is used as an input terminal. An output signal is extracted from a drain current of the third transistor. Therefore, only one transconductance adjustment circuit is enough.

18 Claims, 13 Drawing Sheets

FILTER CIRCUIT AND OPTICAL DISK DEVICE INCLUDING THE SAME

CROSS-REFERENCE TO RELATED APPLICATIONS

This is a continuation of PCT International Application PCT/JP2010/004421 filed on Jul. 6, 2010, which claims priority to Japanese Patent Application No. 2009-162007 filed on Jul. 8, 2009 and PCT International Application PCT/JP2010/000798 filed on Feb. 9, 2010. The disclosures of these applications including the specifications, the drawings, and the claims are hereby incorporated by reference in their entirety.

BACKGROUND

The present disclosure relates to filter circuits, and more particularly, to current-mode filter circuits including field effect transistors, and optical disk devices including the current-mode filter circuit in a signal processing path.

A filter circuit is a functional block essential for various signal processing systems. In particular, an analog filter circuit has an important role in shaping a signal waveform before analog-to-digital conversion and removing high-frequency noise for prevention of aliasing in an analog-digital hybrid LSI. In particular, in a signal band between several tens of megahertz and several hundreds of megahertz, a Gm-C filter including a transconductance circuit (hereinafter referred to as a Gm circuit) and a capacitive element is typically employed.

However, the Gm-C filter has the following problems (see "CMOS Continuous-Time Current-Mode Filters for High-Frequency Applications," IEEE J. Solid-State Circuits, vol. 28, pp. 323-329, March 1993 (hereinafter referred to as NON-PATENT DOCUMENT 1), and "A Current Mirror with Controllable Second-Order Low-Pass Function," TECHNICAL REPORT OF IEICE ICD, Vol. 99, No. 316, pp. 71-77, 1999 (hereinafter referred to as NONPATENT DOCUMENT 2).

1. The parasitic pole of the Gm circuit in the filter is in the proximity of the pole of the filter. Therefore, it is difficult to achieve accurate frequency characteristics, particularly in a high frequency region.

2. It is difficult to ensure a wide dynamic range and linearity of a Gm-C filter operating in a voltage mode in a digital CMOS process with low voltage operation which is provided by recent microfabrication technology.

In an effort to address these problems, NONPATENT DOCUMENTS 1 and 2 have proposed filter circuits which operate in the current mode. In NONPATENT DOCUMENT 1, as shown in FIG. 2(a) in the document, an output current is fed back. In NONPATENT DOCUMENT 2, as shown in FIG. 8 in the document, a capacitive element is added to a gate grounded mirror circuit. The filter circuit of NONPATENT DOCUMENT 2 includes a smaller number of elements than that of NONPATENT DOCUMENT 1. Here, the filter circuit of NONPATENT DOCUMENT 2 having a configuration more similar to that of the present disclosure will be described in detail. FIG. 15 shows a configuration of the current-mode filter of NONPATENT DOCUMENT 2. In the current-mode filter of FIG. 15, N-channel transistors M200 and M203 form a current mirror pair. Each of the N-channel transistors M200 and M203 is driven by a bias current Ib0 from a current source. A P-channel transistor M201 functions as a gate grounded circuit whose gate is fixed to a constant voltage Vb0 and is driven by a bias current Ic0. The source of the P-channel transistor M201 is connected to the drain of the N-channel transistor M200, and the drain of the P-channel transistor M201 is connected to the gate of the N-channel transistor M200. As a result, the N-channel transistor M200 and the P-channel transistor M201 form a negative feedback loop. Capacitive elements Ci and Cg are connected to the drain and gate of the N-channel transistor M200, respectively. In this case, if the N-channel transistors M200 and M203 and the P-channel transistor M201 operate in their saturated regions, the transconductances (hereinafter referred to as gm) of the N-channel transistors M200 and M203 and the P-channel transistor M201 can be approximated by:

$$gmn = \sqrt{2 \cdot \beta n \cdot Ib0} \quad (1)$$

$$gmp = \sqrt{2 \cdot \beta p \cdot Ic0} \quad (2)$$

where gmn is the gm of the N-channel transistor M200, M203, gmp is the gm of the P-channel transistor M201, $\beta n$ is the transconductance parameter of the N-channel transistor M200, M203, and $\beta p$ is the transconductance parameter of the P-channel transistor M201.

Here, if the drain of the N-channel transistor M200 is used as a current input (Ii) terminal, and the drain of the N-channel transistor M203 is used as a current output (Io) terminal, the input/output transfer function is represented by:

$$\frac{Io}{Ii} = -\frac{\omega 0^2}{s^2 + \frac{\omega 0}{Q} \cdot s + \omega 0^2} \quad (3)$$

$$\omega 0 = \sqrt{\frac{gmn \cdot gmp}{Ci \cdot Cg}}$$

$$Q = \sqrt{\frac{gmn \cdot Ci}{gmp \cdot Cg}}$$

Expression 3 shows the transfer function of a second-order low-pass filter (hereinafter abbreviated to "LPF"), i.e., that the circuit configuration of FIG. 15 functions as a current-mode second-order LPF. As can also be seen from Expression 3, the value $\omega 0$ and the Q factor indicating the frequency characteristics are determined by gmp, gmn, Ci, and Cg.

SUMMARY

In a device for recording and reproducing a high-density recording optical disk (e.g., a Blu-ray Disc etc.), the frequency band required for analog signal processing at high speed exceeds 100 MHz, and therefore, the Gm-C filter typically used in a conventional DVD recording/reproduction device has difficulty in simultaneously achieving a wider band, linearity, and a dynamic range. Therefore, the current-mode filter, which can simultaneously achieve these properties, has received attention.

Incidentally, the transconductance parameters $\beta n$ and $\beta p$ and the capacitances Ci and Cg significantly depend on variations in manufacturing process, and therefore, it is necessary to adjust filter characteristics for a filter circuit, which requires accurate frequency characteristics. Although this adjustment is performed in various steps, such as the step of testing the product before shipment, the step of booting the LSI, etc., the adjustment is performed only once, which is common to these steps. Therefore, only the variations in manufacturing process are adjusted. For example, variations in a temperature-dependent parameter cannot be accommodated only by the adjustment of the steps. In general, it is known that capacitive elements produced by the CMOS process have less dependency on temperature. However, the transconductance parameter has significant dependency on temperature, and has a non-negligible influence on the filter characteristics, and therefore, means for automatically compensating for temperature-dependent fluctuations in the transconductance parameter is required. However, neither NONPATENT DOCUMENT 1 nor 2 describes a technique of achieving this means.

Conventional current-mode filters have the following problems.

(1) A transconductance adjustment circuit is required for each of the N- and P-channel transistors, and therefore, a large circuit mounting area is required.

(2) There is not a conventional current-mode band-pass filter or high-pass filter other than current-mode low-pass filters, resulting in lack of applicability.

Moreover, the conventional transconductance adjustment circuit of FIG. 16 has the following problems.

(3) Voltage comparison operation is required, and therefore, an operation amplifier is required, so that it is difficult to reduce the voltage.

(4) A relatively large capacitive element is required in order to ensure the stability of the negative loop, and therefore, it is disadvantageously difficult to reduce the area.

The present disclosure describes implementations of a technique of solving the problems with mounting area, applicability, and low voltage operation, more particularly, a current-mode filter having a minimum configuration, a transconductance adjustment circuit suitable for low voltage or small area, and a high-pass filter and a band-pass filter capable of operating in the current mode which are not provided in the conventional art.

The above problem with compensation for temperature fluctuations of the transconductance parameter can be solved by combining the transconductance adjustment circuit of PATENT DOCUMENT 1 with the filter circuit of FIG. 15. FIG. 16 shows the transconductance adjustment circuit of PATENT DOCUMENT 1. The transconductance adjustment circuit of FIG. 16 includes a potential difference generation circuit which applies voltages of V0a+V1a/2 and V0a−V1a/2 to the gates of a ninth and an eleventh transistor M106 and M107, respectively, a current mirror circuit which calculates a difference between the drain currents of the transistors M106 and M107, and outputs the resulting current ΔIa, a resistance Re which converts the current mirror output into a voltage, a voltage-to-current conversion circuit 30 which compares the voltage obtained by current-to-voltage conversion by the resistance Re with a reference voltage V2a, and outputs the comparison result as a current value I1c, and a section which converts the current value I1c into a voltage, and feeds the output voltage as V0a back to the gate inputs of the transistors M106 and M107. These parts are connected so that the current mirror output of the current value I1c is used as the bias current Ib of FIG. 15. If the transistors M107 and M106 operate in their saturated regions, the drain currents I1a and I1b of the transistors M106 and M107 are represented by:

$$I1a = \frac{\beta n}{2} \cdot \left(V0a - Vtn - \frac{V1a}{2}\right)^2 \quad (4)$$

$$I1b = \frac{\beta n}{2} \cdot \left(V0a - Vtn + \frac{V1a}{2}\right)^2$$

where βn is the transconductance parameter of the N-channel transistor, and Vtn is the threshold voltage of the N-channel transistor. In the circuit of FIG. 16, feedback is applied so that a voltage value obtained by voltage conversion of the differential current ΔIa between the currents I1a and I1b using the resistance Re is equal to the reference voltage V2a, and therefore, the following expression is established:

$$\Delta Ia \cdot Re = V2a \quad (5)$$

If the transistors M108, M204, M107, and M106 have the same transistor size, an output voltage V0a is represented by the following expression by using Expressions 4 and 5:

$$V0a = \frac{1}{\beta n \cdot Re} \cdot \frac{V2a}{V1a} + Vtn \quad (6)$$

If the current mirror ratio of the drain current of the transistor M204 to the output current Ib of the transconductance adjustment circuit is 1:1, the output current Ib is represented by:

$$Ib = I1c = \frac{1}{2 \cdot \beta n} \cdot \left(\frac{V2a}{Re \cdot V1a}\right)^2 \quad (7)$$

If this is substituted into Expression 1, the gm of the N-channel transistor included in the current-mode filter circuit is represented by the following expression which does not include the transconductance parameter:

$$gmn = \frac{V2a}{Re \cdot V1a} \quad (8)$$

Expression 8 represents the gma of the N-channel transistor. In the circuit of FIG. 16, if the N- and P-channel transistors are replaced with P- and N-channel transistors, respectively, the gm of the P-channel transistor can be represented by an expression similar to Expression 8.

Therefore, ω0 and Q in Expression 3 do not depend on the transconductance parameter, and can be arbitrarily controlled by changing V2a, V1a, and Re.

In order to provide a current-mode filter including a minimum number of parts, an example filter circuit of the present disclosure includes a current mirror circuit including field effect transistors, a first, a second, and a third transistor having the same channel polarity, a first and a second capacitive element connected to the gate and drain of the first transistor, respectively, and a bias current supplying section configured to supply a bias current to each of the first and second transistors. The drain of the first transistor is connected to the source of the second transistor functioning as a gate grounded circuit. The drain of the second transistor is connected to the gate of the first transistor and the gate of the third transistor. One or both of the drain and gate of the first transistor is used as an input terminal or input terminals to extract an output signal from a drain current of the third transistor.

Another example filter circuit of the present disclosure includes a current mirror circuit including field effect transistors, a first, a second, a third, and a fourth transistor having the same channel polarity, a first and a second capacitive element connected to the gate and drain of the first transistor, respectively, a first bias current supplying section configured to supply a bias current to each of the first and second transistors, and a second bias current supplying section configured to supply a bias current to the fourth transistor. The fourth transistor operates as an I/V converter which converts an input current signal into a voltage signal. The drain of the first transistor is connected to the source of the second transistor functioning as a source follower which receives an output of the I/V converter. The drain of the second transistor is connected to the gate of the first transistor and the gate of the third transistor. One or both of the drains of the first and fourth transistors is used as an input terminal or input terminals to extract an output signal from a drain current of the third transistor.

A still another example filter circuit of the present disclosure includes a current mirror circuit including field effect transistors, a first, a second, and a third transistor having the same channel polarity, a first and a second capacitive element connected to the gate and drain of the first transistor, respectively, and a bias current supplying section configured to supply a bias current to each of the first and second transistors. The drain of the first transistor is connected to the gate of the second transistor functioning as a source follower. The source of the second transistor is connected to the gate of the first transistor and the gate of the third transistor. One or both of the drain and gate of the first transistor is used as an input terminal or input terminals to extract an output signal from a drain current of the third transistor.

In the present disclosure, all transistors determining the filter characteristics have the same channel polarity, i.e., all transistors included in the circuit can be N-channel transistors or can be P-channel transistors, and therefore only one transconductance adjustment circuit is enough.

In order to provide a band-pass filter which operates in the current mode, the filter circuit of the present disclosure may further include a fourth transistor having a negative loop from the drain to the gate, and a bias current supplying section configured to supply a bias current to the fourth transistor. The first capacitive element may be connected between the gate of the fourth transistor and the drain of the first transistor. The gate of the fourth transistor may be used as an input terminal to extract an output signal from a drain current of the third transistor.

In order to provide a high-pass filter which operates in the current mode, the filter circuit of the present disclosure may include a fourth transistor having a negative loop from the drain to the gate, and a bias current supplying section configured to supply a bias current to the fourth transistor. The second capacitive element may be connected between the gate of the fourth transistor and the gate of the first transistor. The gate of the fourth transistor may be used as an input terminal to extract an output signal from a drain current of the third transistor.

In the filter circuit of the present disclosure, the bias currents supplied to the first to third transistors or the first to fourth transistors may be variable.

Next, in order to allows the transconductance adjustment circuit which supplies variable a bias current to each of the first to third transistors or the first to fourth transistors, the filter circuit of the present disclosure may employ the following configuration. The variable bias currents may be supplied from a transconductance adjustment circuit. The transconductance adjustment circuit may include a ninth and a tenth transistor whose sources are connected together, a potential difference generation circuit configured to generate a potential difference between the gates of the ninth and tenth transistors, a differential current generation circuit configured to output a difference between drain currents of the ninth and tenth transistors, a feedback section configured to generate a control voltage so that an output current value of the differential current generation circuit matches an output current value of a reference current source, and feed the control voltage back to the gates of the ninth and tenth transistors, and a voltage-to-current converter configured to convert the feedback voltage into a current. The bias currents supplied to the first to third transistors or the first to fourth transistors may each be supplied as a current mirror output of an output of the voltage-to-current converter.

In order to provide a feedforward transconductance adjustment circuit which does not include a negative loop, does not require a large capacitive element for ensuring stability, and requires only a smaller area, the filter circuit of the present disclosure may employ the following configuration. Specifically, the filter circuit of the present disclosure may include a translinear loop circuit including a fifth, sixth, seventh, and eighth transistors, an amplification section configured to multiply a current flowing through each of the seventh and eighth transistors by a predetermined factor, and supply the resulting currents to the fifth and sixth transistors, and a current source circuit configured to supply a bias current to the seventh transistor. A current mirror output of a current flowing through the eighth transistor may be used as a bias current for the first to third transistors or the first to fourth transistors.

In the filter circuit of the present disclosure, the current source circuit configured to supply a bias current to the seventh transistor, may include a ninth and a tenth transistor whose sources are connected together, a potential difference generation circuit configured to generate a potential difference between the gates of the ninth and tenth transistors, and apply an average voltage of gate voltages of the ninth and tenth transistors to the gate of an eleventh transistor, an addition section configured to add up drain currents flowing through the ninth and tenth transistors, and an amplification section configured to multiply a drain current flowing through the eleventh transistor by a factor of two. A current obtained by subtracting the current obtained by multiplying the drain current flowing through the eleventh transistor by a factor of two from the addition value of the drain currents of the ninth and tenth transistors, may be used as a bias current for the first to third transistors or the first to fourth transistors.

In addition, an example optical disk device of the present disclosure includes the filter circuit in a signal processing path.

The optical disk device includes the filter circuit in a signal processing path, and therefore, can record and reproduce a high-speed and high-density recording disk at low cost and low power consumption. This is because a current-mode filter which simultaneously achieve a wider band, linearity, and a dynamic range can be mounted in a small area and operated at a low voltage.

An example transconductance adjustment circuit of the present disclosure includes a first and a second transistor whose sources are connected together; a potential difference generation circuit configured to generate a potential difference between the gates of the first and second transistors; a differential current generation circuit configured to output a difference between drain currents of the first and second transistors; a feedback section configured to generate a control voltage so that an output current value of the differential current generation circuit matches an output current value of a reference current source, and feed the control voltage back to the gates of the first and second transistors; and a voltage-to-current converter configured to convert the feedback voltage into a current. A transconductance is adjusted using an output current of the voltage-to-current converter.

As described above, according to the filter circuit of the present disclosure, all transistors which determine filter characteristics have the same N- or P-channel polarity, and therefore, only one transconductance adjustment circuit is enough, resulting in a reduction in the circuit mounting area.

DETAILED DESCRIPTION

Embodiments of the present disclosure will be described in detail with reference to the accompanying drawings.

First Embodiment

Figure 1:
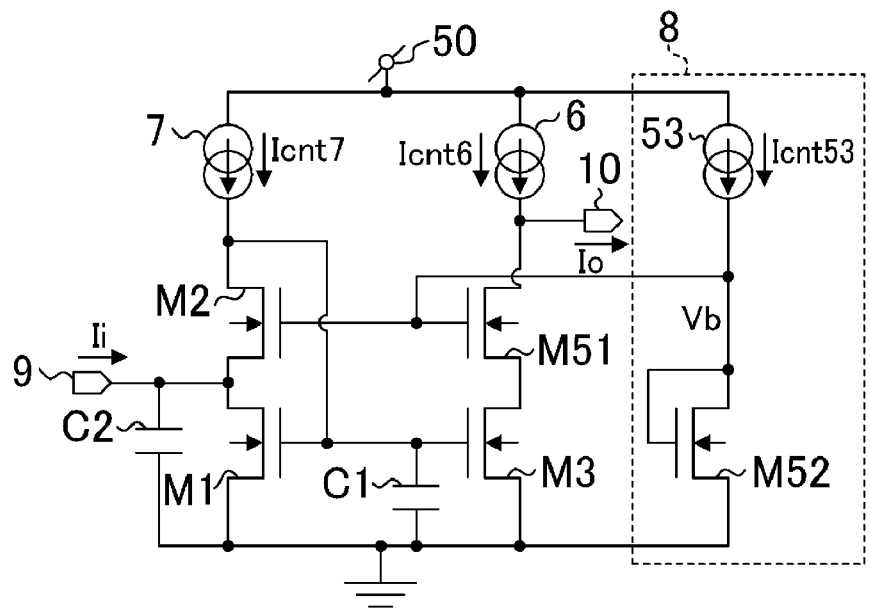
FIG. 1 is a diagram showing a low-pass filter circuit according to a first embodiment of the present disclosure.

FIG. 1 shows a current-mode filter circuit according to a first embodiment of the present disclosure.

The configuration of FIG. 1 is a filter circuit described in claim 1 in which all transistors included in the current-mode filter circuit are N-channel transistors.

In FIG. 1, a first transistor M1 and a second transistor M2 are connected in cascode. The drain of the transistor M2 is connected to the gate of the transistor M1. The transistors M1 and M2 are both biased by a current Icnt7 supplied from a current source (bias current supplying section) 7. The gate of the transistor M2 is connected to a voltage generation circuit 8 and grounded for alternating current. The voltage generation circuit 8 outputs a voltage Vb which is obtained by supplying a current Icnt53 output from a current source (bias current supplying section) 53 to a diode-connected fourth transistor M52. A current input terminal 9 and the source of the transistor M2 are connected in common to one end of a capacitive element C2, and the gates of a third transistor M3 and the transistor M1 are connected in common to one end of a capacitive element C1. The other ends of the capacitive elements C1 and C2 are connected to the ground. A transistor M51 is connected to the drain of the transistor M3 in cascode in order to reduce a difference between the drain voltages of the transistors M1 and M3. The drain of the transistor M51 and an the output terminal 10 are connected in common to a current source 6 in order to extract, as an output, a difference between the drain current of the transistor M51 and the bias current Icnt6 of the current source 6.

Here, it is assumed that $Icnt6/Icnt7=\beta 3/\beta 1$ is established so that the current output Io is zero when the current input Ii is zero, where $\beta 1$, $\beta 2$, and $\beta 3$ are the transconductance parameters of the transistors M1, M2, and M3, respectively.

If all the transistors operate in their saturated regions, the transconductances gm1, gm2, and gm3 of the transistors M1, M2, and M3 are represented by:

$$gm1 = \sqrt{2 \cdot \beta 1 \cdot Icnt7}$$

$$gm2 = \sqrt{2 \cdot \beta 2 \cdot Icnt7}$$

$$gm3 = \sqrt{2 \cdot \beta 3 \cdot Icnt6} \tag{9}$$

If $\beta 3$ and Icnt6 are selected so that $gm3 = A0 \cdot gm1$ is established, the transfer function Io/Ii of the configuration of FIG. 1 is calculated by:

$$\frac{Io}{Ii} = -\frac{A0 \cdot \omega 0^2}{s^2 + \frac{\omega 0}{Q}s + \omega 0^2} \tag{10}$$

where:

$$\omega 0 = \sqrt{\frac{gm1 \cdot gm2}{C1 \cdot C2}} \tag{11}$$

$$Q = \sqrt{\frac{gm1 \cdot C2}{gm2 \cdot C1}}$$

$$A0 = \frac{gm3}{gm1}$$

Expression 10 is the transfer function of a second-order low-pass filter (hereinafter abbreviated to "LPF"), and gm1 and gm2 for determining the filter parameters $\omega 0$ and Q factor can be achieved for the transconductances of all the N-channel transistors. Therefore, only one transconductance adjustment circuit is enough.

As can be seen from Expression 10, the current-mode filter of FIG. 1 can change the transfer gain independently of $\omega 0$ and Q by changing A0, in addition to $\omega 0$ and Q. Because A0 is determined by the ratio of gm1 to gm3 as described above, A0 can be changed by switching Icnt6 and $\beta 3$ (i.e., the bias current and transistor size of the transistor M3) according to Expression 9.

Next, an operating power supply voltage for the current-mode filter of FIG. 1 will be described. The dynamic range of the current-mode filter of FIG. 1 is determined by the current source 7 and the transistor M1. If the current source 7 includes a P-channel transistor, a power source voltage Vdd at which the current-mode filter of FIG. 1 can operate is represented by:

$$Vdd > Vtn + Vodn + Vodp \quad (12)$$

where Vodp is an overdrive voltage for the P-channel transistor, Vtn is the threshold voltage of the transistor M1, and Vodn is an overdrive voltage for the transistor M1.

In general, in a recent digital CMOS process, the maximum Vtn is as low as 0.4 V, and therefore, if the overdrive voltage of the transistor is set to about 0.4 V, Vdd>0.4+0.4+0.4=1.2 V is obtained from Expression 12, and therefore, a filter circuit can be achieved for a power source voltage as low as that for a digital circuit.

Figure 2:
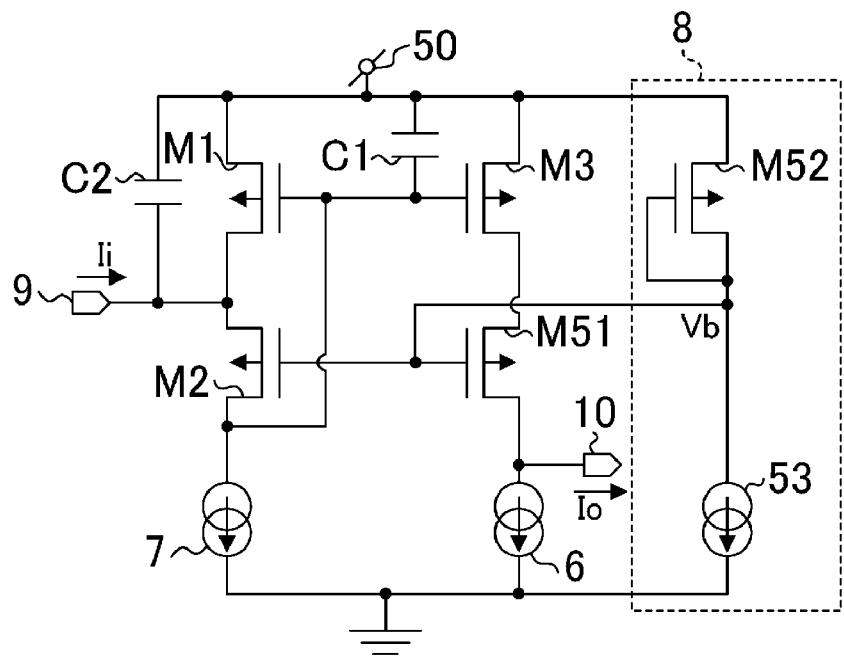
FIG. 2 is a diagram showing a filter circuit in which transistors included in the filter circuit of FIG. 1 are replaced with P-channel transistors.

Although the current-mode filter of the embodiment of FIG. 1 includes N-channel transistors, the N-channel transistors may be replaced with P-channel transistors as shown in FIG. 2.

The transistor M51 of FIG. 1 is used to obtain a more accurate current mirror ratio of the transistors M1 and M3. Therefore, even if the transistor M51 of FIG. 1 is removed, there is not an influence on the filter parameters ω0 and Q factor.

Figure 3:
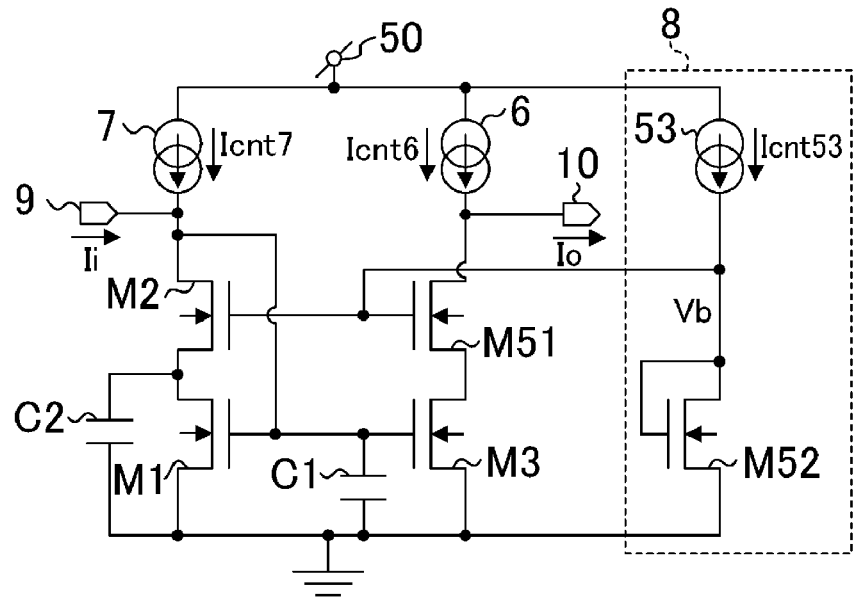
FIG. 3 is a diagram showing a filter circuit in which an input terminal of the filter circuit of FIG. 1 is changed.

FIG. 3 shows a variation of the configuration of FIG. 1 in which the input terminal 9 is connected to the drain of the transistor M2 instead of the source of the transistor M2. The transfer function Io/Ii of the configuration of FIG. 3 is calculated by:

$$\frac{Io}{Ii} = -A0 \cdot \left( \frac{\omega 0^2}{s^2 + \frac{\omega 0}{Q}s + \omega 0^2} + \frac{A1 \cdot \frac{\omega 0}{Q} s}{s^2 + \frac{\omega 0}{Q}s + \omega 0^2} \right) \quad (13)$$

where ω0, Q, and A0 are the same as those in Expression 11, and A1 is represented by:

$$A1 = \frac{gm1 \cdot C2}{gm2 \cdot C1} \quad (14)$$

Figure 4:
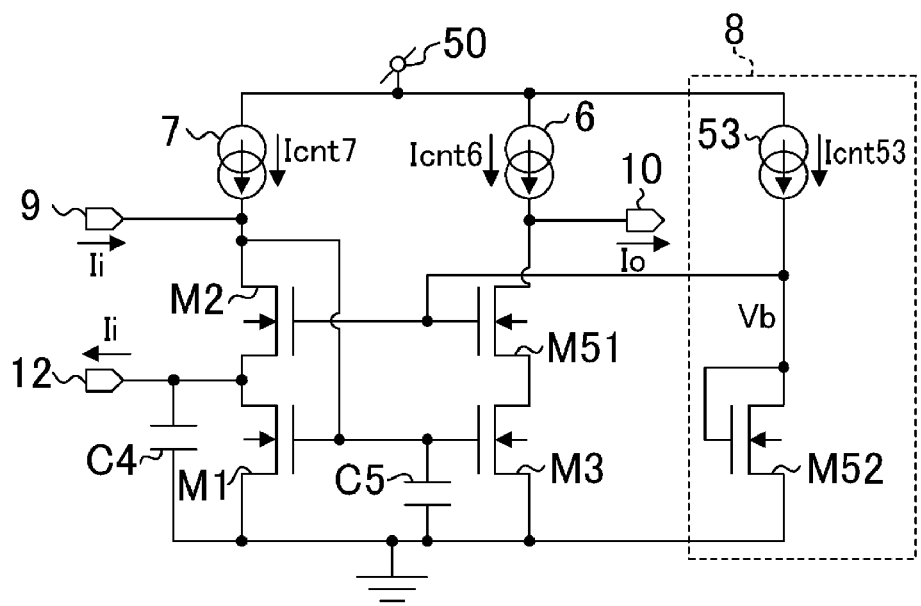
FIG. 4 is a diagram showing a band-pass filter circuit in which the input terminal of the filter circuit of FIG. 1 is changed.

The first term on the right side of Expression 13 represents the transfer function of a second-order LPF which is the same as that in Expression 10, and the second term on the right side represents the transfer function of a second-order band-pass filter (hereinafter abbreviated to "BPF"). In other words, the current-mode filter having the configuration of FIG. 3 can obtain an output signal having a combination of the characteristics of a second-order LPF and the characteristics of a second-order BPF. As can be seen from Expressions 10 and 13, when the signal Ii is input from the drain of the transistor M2, and a signal −Ii whose phase is inverted by 180° from the phase of the signal Ii is input from the source of the transistor M2, the transfer function Io/Ii of the second-order BPF described below can be obtained. A configuration corresponding to this is shown in FIG. 4.

$$\frac{Io}{Ii} = -A0 \cdot \frac{A1 \cdot \frac{\omega 0}{Q} s}{s^2 + \frac{\omega 0}{Q}s + \omega 0^2} \quad (15)$$

where ω0, Q, and A0 are the same as those in Expression 11, and A1 is the same as that in Expression 14.

Figure 17:
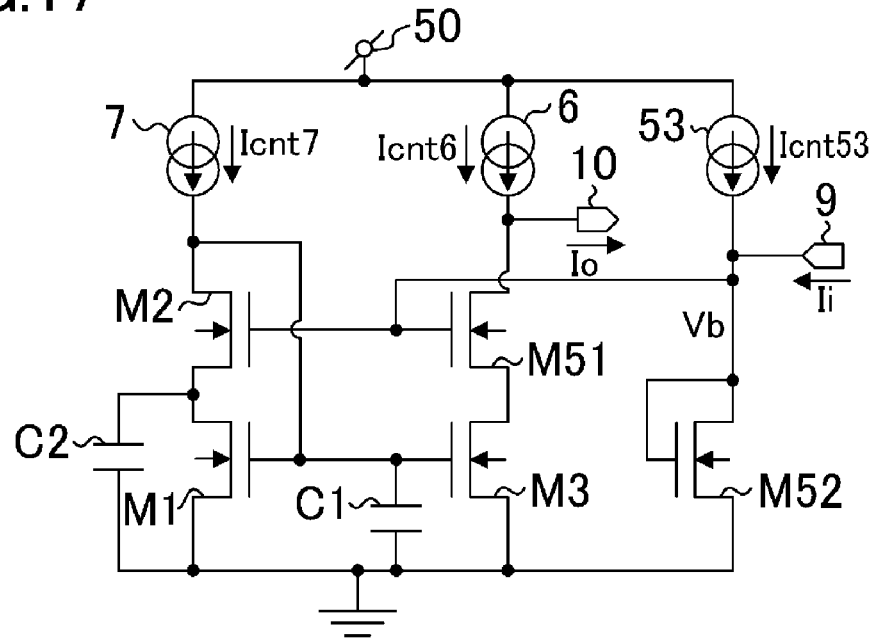
FIG. 17 is a diagram showing a variation of the low-pass filter circuit of FIG. 1.
Figure 18:
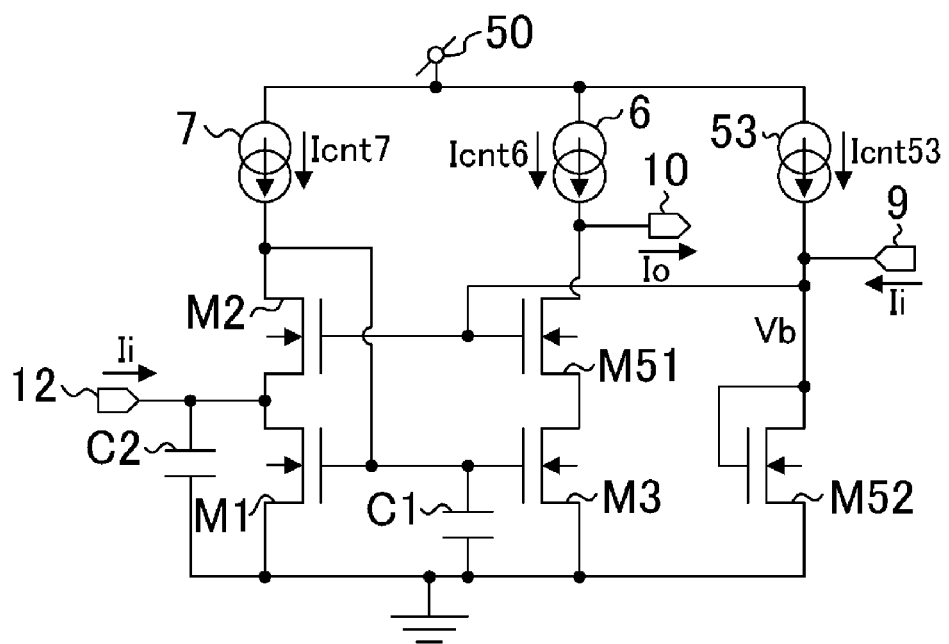
FIG. 18 is a diagram showing another variation of the low-pass filter circuit of FIG. 1.

As another form of the second-order BPF, the drain of the transistor M52 may be used as the input terminal 9, instead of the source of the transistor M2 in FIG. 1, to extract an output current signal through the output terminal 10. Also in this case, the transfer function of Expression 15 can be obtained. This configuration described in claim 2 is shown in FIG. 17. Alternatively, as shown in FIG. 18, the sources of the transistors M2 and M52 may be used as input terminals 12 and 9, respectively, to extract an output current signal through the output terminal 10, whereby the transfer characteristics of Expression 13 can be obtained.

Second Embodiment

Figure 5:
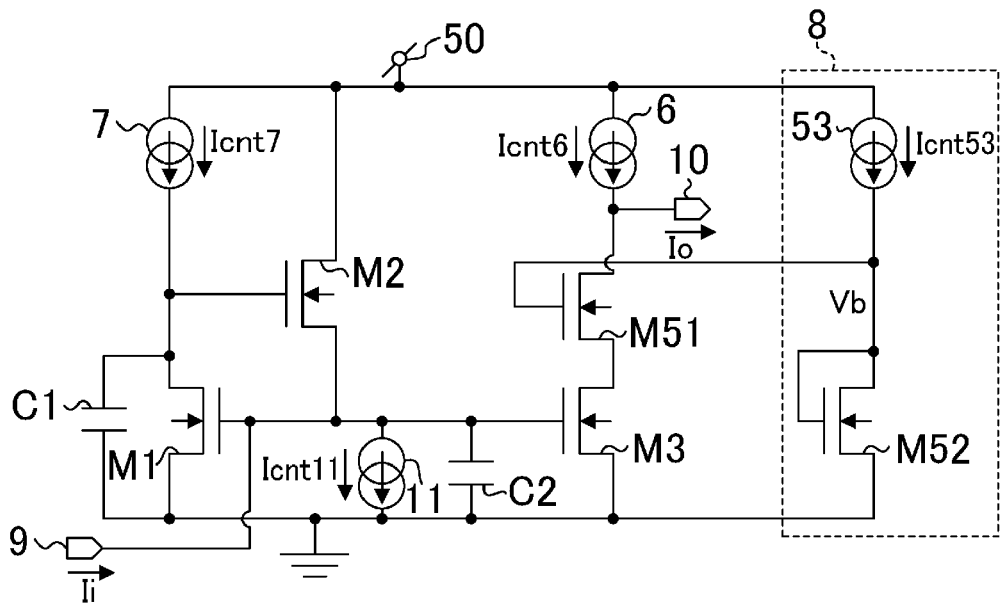
FIG. 5 is a diagram showing a low-pass filter circuit according to a second embodiment of the present disclosure.

FIG. 5 shows a current-mode filter circuit according to a second embodiment of the present disclosure.

The configuration of FIG. 5 is a filter circuit described in claim 3 in which all transistors included in the current-mode filter circuit are N-channel transistors. In FIG. 5, the drain voltage of a transistor M1 is fed back to the gate of the transistor M1 via a source follower including a transistor M2 and a current source 11 for supplying a current Icnt11. The transistor M1 is biased by a current Icnt7 supplied from a current source 7. A capacitive element C2 is connected to the source of the transistor M2 connected to a current input terminal 9, and a capacitive element C1 is connected to the drain of the transistor M1. The capacitive elements C1 and C2 are also connected to the ground. A transistor M51 is connected in cascode to the drain of a transistor M3 in order to reduce a difference between the drain voltages of the transistors M1 and M3. The drain of the transistor M51 and an output terminal 10 are connected in common to a current source 6 in order to extract a difference between the drain current of the transistor M51 and a bias current Icnt6 supplied from the current source 6. The gate of the transistor M51 is connected to a voltage generation circuit 8 and grounded for alternating current. The voltage generation circuit 8 outputs a voltage Vb which is obtained by supplying a current Icnt53 output from a current source 53 to a diode-connected transistor M52. Here, it is assumed that Icnt6/Icnt7=β3/β1 is established so that the current output Io is zero when the current input Ii is zero, where β1, β2, and β3 are the transconductance parameters of the transistors M1, M2, and M3, respectively.

If all the transistors operate in their saturated regions, the transconductances gm1, gm2, and gm3 of the transistors M1, M2, and M3 are represented by:

$$gm1 = \sqrt{2 \cdot \beta 1 \cdot Icnt7}$$

$$gm2 = \sqrt{2 \cdot \beta 2 \cdot Icnt11}$$

$$gm3 = \sqrt{2 \cdot \beta 3 \cdot Icnt6} \quad (16)$$

If β3 and Icnt6 are selected so that gm3=A0·gm1 is established, the transfer function Io/Ii of the configuration of FIG. 5 is calculated as follows, thereby obtaining the transfer characteristics of a second-order BPF which is the same as those of the filter of the first embodiment as in Expression 15.

$$\frac{Io}{Ii} = -\frac{A0 \cdot \omega 0^2}{s^2 + \frac{\omega 0}{Q}s + \omega 0^2} \quad (17)$$

-continued where:

$$\omega 0 = \sqrt{\frac{gm1 \cdot gm2}{C1 \cdot C2}} \quad (18)$$

$$Q = \sqrt{\frac{gm1 \cdot C2}{gm2 \cdot C1}}$$

$$A0 = \frac{gm3}{gm1}$$

In the second embodiment of FIG. 5, a bias current for the transistor M1 is supplied from the current source 7, and a bias current for the transistor M2 is supplied from the current source 11, and therefore, the values of the currents supplied from the current sources 7 and 11 can be adjusted independently of each other. As a result, gm1 and gm2 can be adjusted independently of each other. Therefore, compared to the first embodiment, a current-mode filter having a high level of flexibility of adjustment of filter parameters can be mounted in a small area.

Next, an operating power supply voltage for the current-mode filter of FIG. 5 will be described. The dynamic range of the current-mode filter of FIG. 5 is determined by the current source 7 and the transistors M1 and M2. If the current source 7 includes a P-channel transistor, a power source voltage Vdd at which the current-mode filter of FIG. 5 can operate is represented by:

$$Vdd > 2 \cdot (Vtn + Vodn) + Vodp \quad (19)$$

where Vodp is an overdrive voltage for the P-channel transistor, Vtn is the threshold voltage of the transistor M1, M2, and Vodn is an overdrive voltage for the transistor M1, M2.

If Vtn=Vodn=Vodp=0.4 V, Vdd>2(0.4+0.4)+0.4=2 V. Therefore, a power source voltage higher than that for the configuration of the first embodiment is required.

Figure 6:
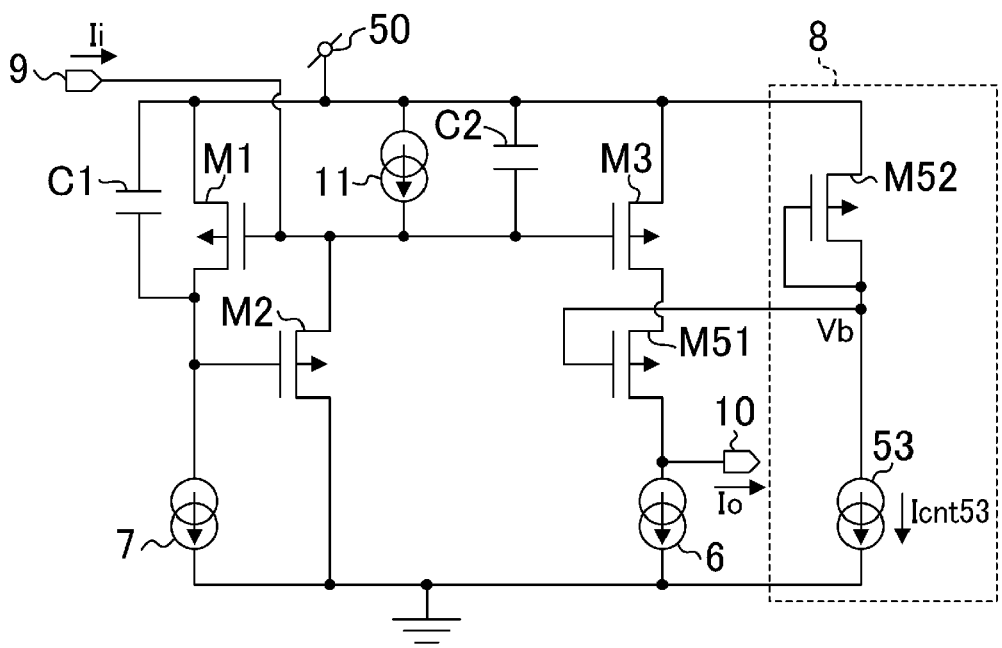
FIG. 6 is a diagram showing a filter circuit in which transistors included in the filter circuit of FIG. 5 are replaced with P-channel transistors.

Although the current-mode filter of the embodiment of FIG. 5 includes N-channel transistors, the N-channel transistors may be replaced with P-channel transistors as shown in FIG. 6.

The transistor M51 of FIG. 5 is used to obtain a more accurate current mirror ratio of the transistors M1 and M3. Therefore, even if the transistor M51 of FIG. 5 is removed, there is not an influence on the filter parameters ω0 and Q factor.

Figure 7:
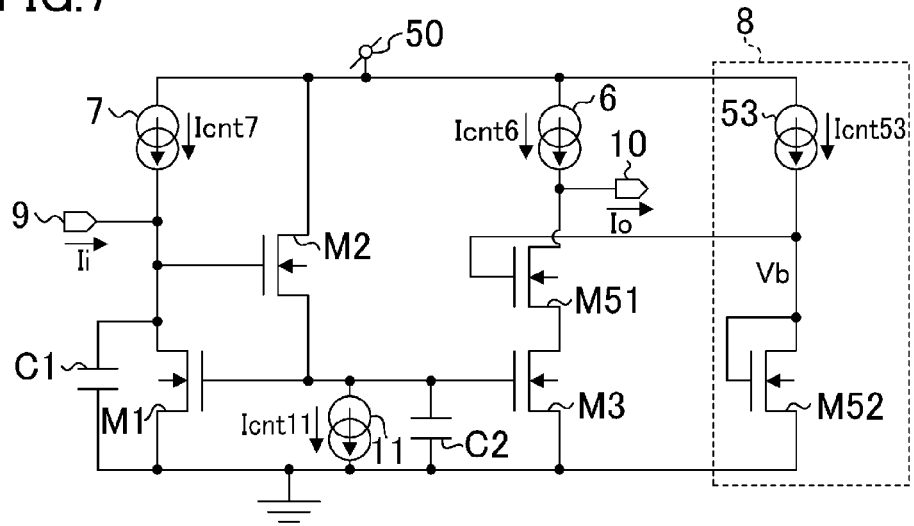
FIG. 7 is a diagram showing a filter circuit in which an input terminal of the filter circuit of FIG. 5 is changed.

FIG. 5 shows a variation of the configuration of FIG. 5 in which the input terminal 9 is connected to the drain of the transistor M1 instead of the source of the transistor M2. The transfer function Io/Ii of the configuration of FIG. 7 is calculated by Expression 17 described in the first embodiment to obtain the characteristics of a second-order LPF.

Figure 8:
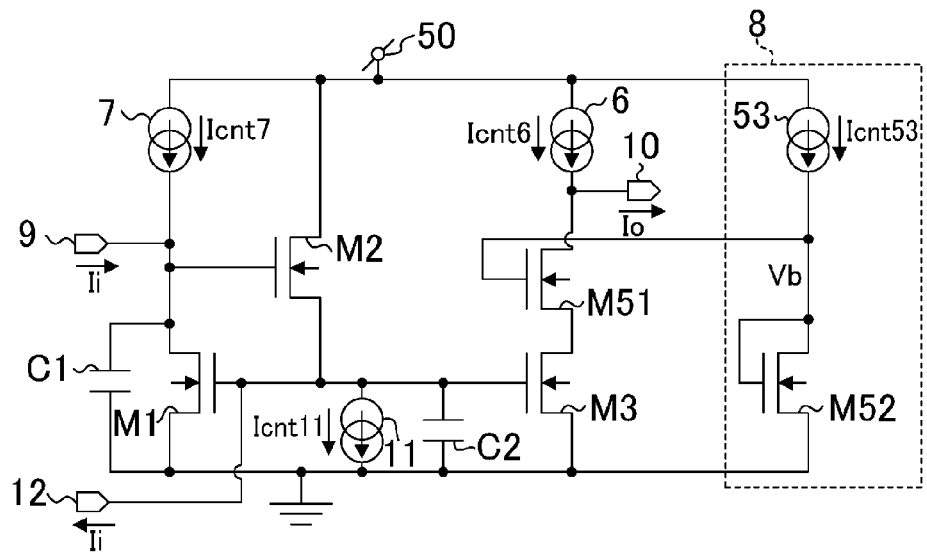
FIG. 8 is a diagram showing a band-pass filter circuit in which the input terminal of the filter circuit of FIG. 5 is changed.

Similar to the first embodiment, when the signal Ii is input from the drain of the transistor M1, and a signal −Ii whose phase is inverted by 180° from the phase of the signal Ii is input from the source of the transistor M2, the transfer characteristics of Expression 13 can be obtained. A configuration corresponding to this is shown in FIG. 8.

Those skilled in the art may determine whether to select the configuration of the first embodiment of FIG. 1 or the configuration of the second embodiment of FIG. 2, depending on the specifications of the power source voltage of an LSI circuit and the specifications of adjustment of the filter characteristics.

Third Embodiment

Figure 9:
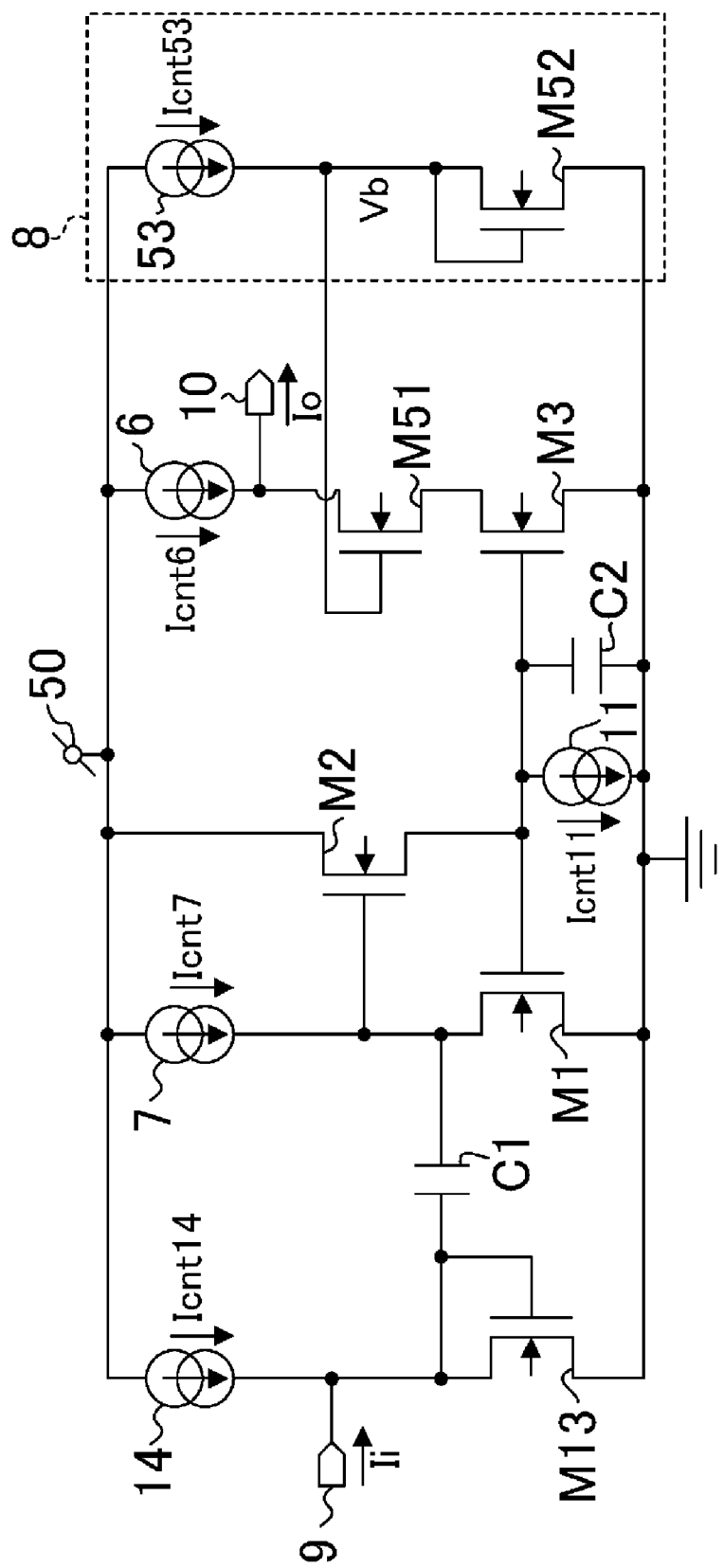
FIG. 9 is a diagram showing a band-pass filter circuit according to a third embodiment of the present disclosure.

FIG. 9 shows a third embodiment corresponding to claim 4.

The configuration of the third embodiment of FIG. 9 is similar to that of the second embodiment of FIG. 7, except that a fourth transistor M13 whose drain and gate are connected together, and a current source 14 for supplying a bias current to the transistor M13, are added, a capacitive element C1 is connected between the transistor M13 and the transistor M1, and the drain of the transistor M13 is connected to the input terminal 9. In this case, if the transistor M13 operates in its saturated region, the transconductance gm13 of the transistor M13 is represented by:

$$gm13 = \sqrt{2 \cdot \beta 13 \cdot Icnt14} \quad (20)$$

where β13 is the transconductance parameter of the transistor M13, and Icnt14 is a bias current supplied from the current source 14. Here, if β13 and Icnt14 are selected so that gm13=gm2 is established, the transfer characteristics Io/Ii of the configuration of FIG. 9 is calculated by the following expression to obtain the transfer characteristics of a second-order BPF.

$$\frac{Io}{Ii} = \frac{A0 \cdot \frac{\omega 0}{Q} s}{s^2 + \frac{\omega 0}{Q} s + \omega 0^2} \quad (21)$$

where:

$$\omega 0 = \sqrt{\frac{gm1 \cdot gm2}{C1 \cdot C2}} \quad (22)$$

$$Q = \sqrt{\frac{C2}{C1}} \cdot \frac{\sqrt{gm1 \cdot gm2}}{gm1 + gm2}$$

$$A0 = \frac{gm3}{gm1 + gm2}$$

The second-order BPF can be implemented in the form described in the second embodiment of FIG. 8. In the configuration of FIG. 8, two terminals, i.e., the input terminals 9 and 12, are required. If the current amplitudes of the input signals Ii and −Ii input thereto are not exactly equal to each other, i.e., there is an error ΔIi, the BPF characteristics indicated by Expression 15 are not obtained. The transfer characteristics are represented by:

$$\frac{Io}{Ii} = -A0 \cdot \left( \frac{\omega 0^2 \cdot \frac{\Delta Ii}{Ii} + A1 \cdot \frac{\omega 0}{Q} s}{s^2 + \frac{\omega 0}{Q} s + \omega 0^2} \right) \quad (23)$$

where ω0, Q, and A0 are the same as those in Expression 11, and A1 is the same as that in Expression 14.

As can be seen from the numerator on the right side of Expression 23, there is a term including the error ΔIi. This means that the zero point is shifted from the origin, and as a result, attenuation characteristics in a low frequency region of the BPF may be deteriorated. In the configuration of this embodiment of FIG. 9, by adding the transistor M13 and the current source 14, a single input terminal can be used to achieve the second-order BPF characteristics. Therefore, the above cause for the error can be removed, resulting in a BPF having satisfactory attenuation characteristics in a low frequency region.

Fourth Embodiment

Figure 10:
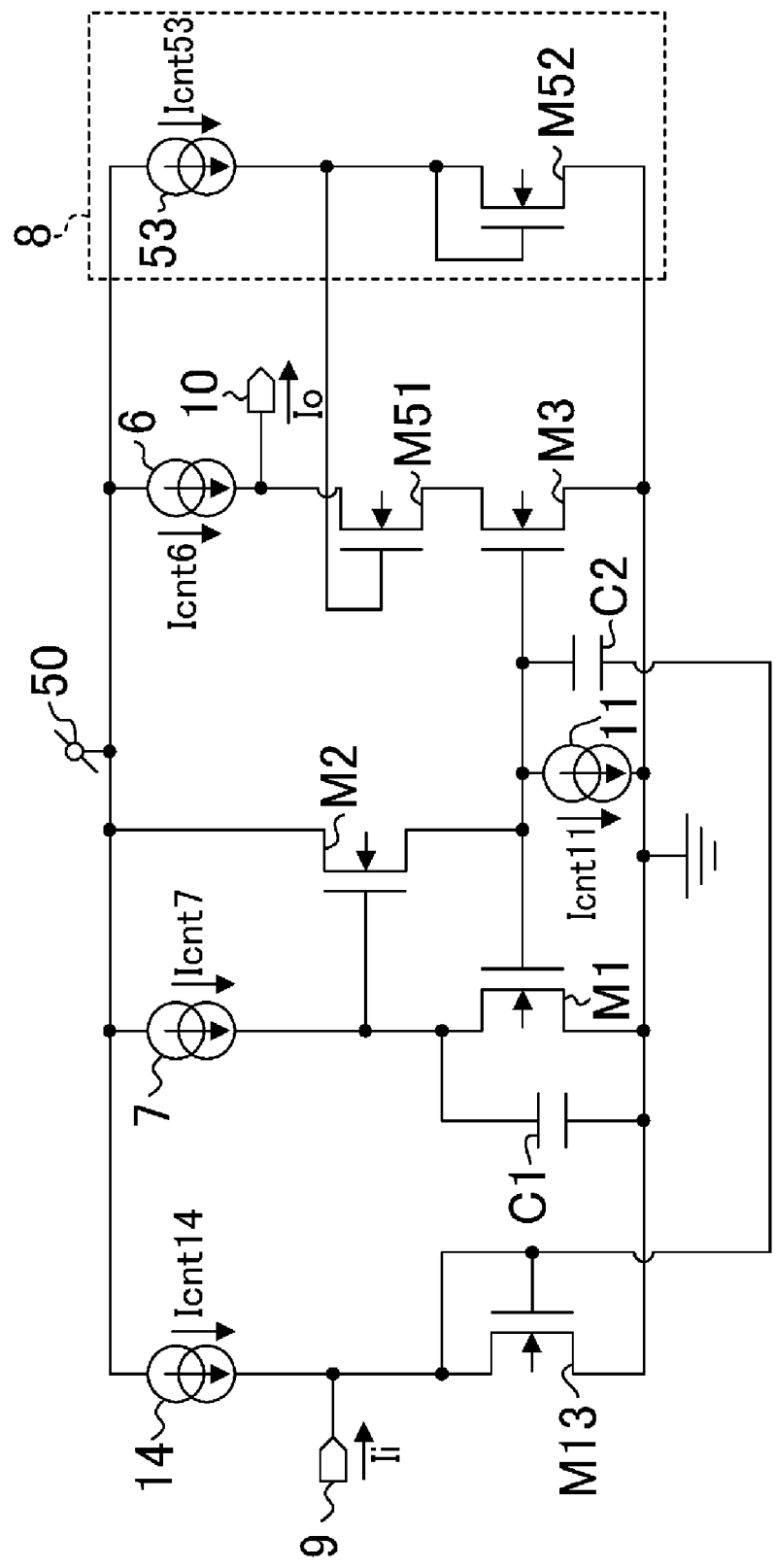
FIG. 10 is a diagram showing a high-pass filter circuit according to a fourth embodiment of the present disclosure.

FIG. 10 shows a fourth embodiment corresponding to claim 5.

The configuration of the fourth embodiment of FIG. 10 is similar to that of the second embodiment of FIG. 5, except that a transistor M13 whose drain and gate are connected together, and a current source 14 for supplying a bias current to the transistor M13, are added, a capacitive element C2 is connected between the transistor M13 and the transistor M1, and the drain of the transistor M13 is connected to the input terminal 9. In this case, if the transistor M13 operates in its saturated region, the transconductance gm13 of the transistor M13 is represented by Expression 20. Here, if gm13=gm2 is established, the transfer characteristics Io/Ii of the configuration of FIG. 9 is calculated by the following expression to obtain the transfer characteristics of a second-order HPF.

$$\frac{Io}{Ii} = \frac{A0 \cdot s^2}{s^2 + \frac{\omega 0}{Q}s + \omega 0^2} \quad (24)$$

Where:

$$\omega 0 = \sqrt{\frac{gm1 \cdot gm2}{2 \cdot C1 \cdot C2}} \quad (25)$$

$$Q = \frac{\sqrt{2 \cdot gm1 \cdot gm2 \cdot C1 \cdot C2}}{gm1 \cdot C2 + gm2 \cdot C1}$$

$$A0 = \frac{gm3}{2 \cdot gm2}$$

Fifth Embodiment

Figure 11:
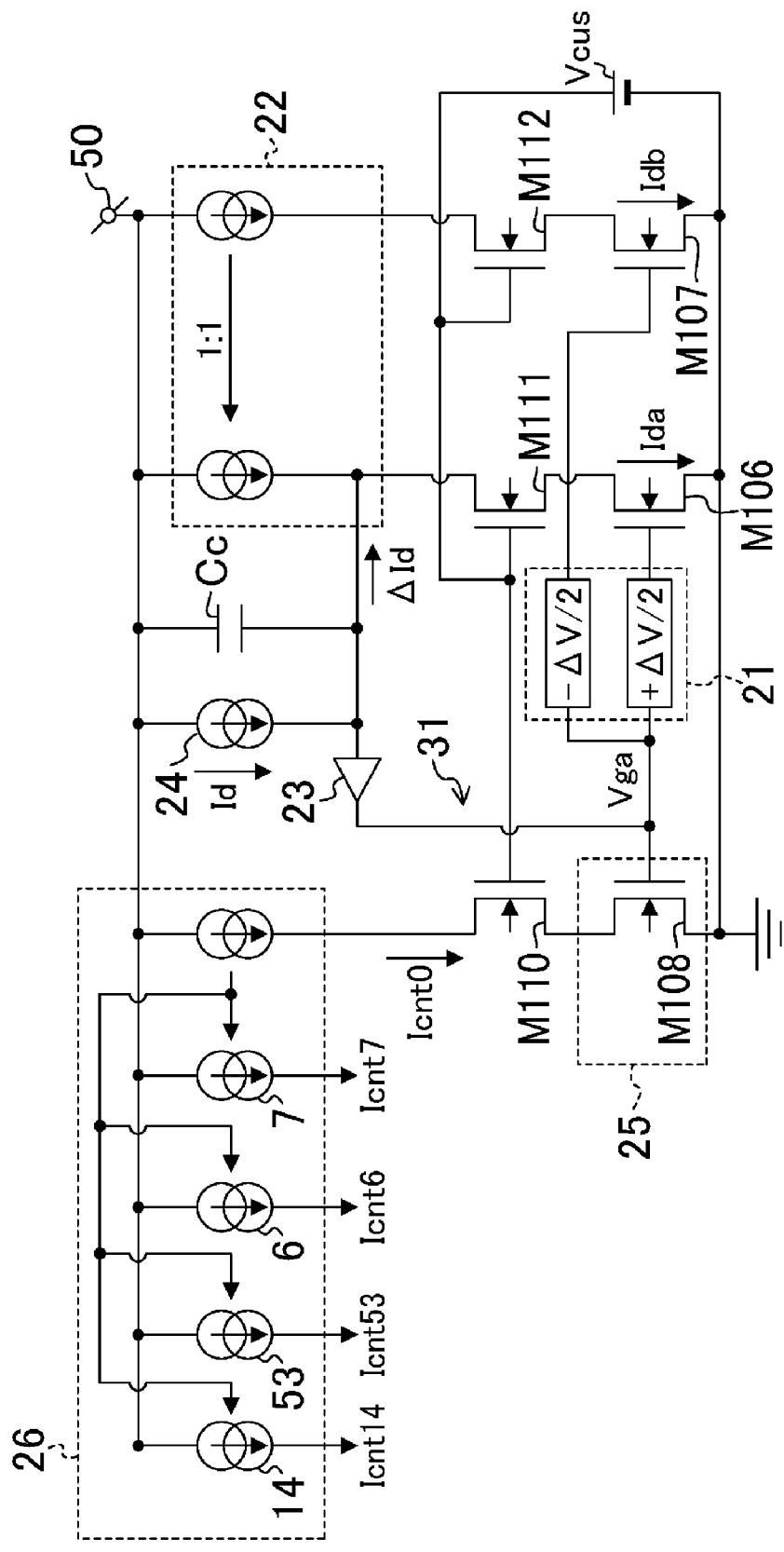
FIG. 11 is a diagram showing a transconductance adjustment circuit according to a fifth embodiment of the present disclosure.

FIG. 11 shows a fifth embodiment corresponding to claims 6 and 7.

FIG. 11 shows example configurations of the bias current sources 6, 7, 53, and 14 in the current-mode filter circuits of the first to fourth embodiments, which are formed by a transconductance adjustment circuit 29. A configuration and operation of the circuit will be described hereafter.

In FIG. 11, a potential difference generation circuit 21 generates voltages Vga+ΔV/2 and Vga−ΔV/2, which are input to the gates of transistors M106 and M107. The drain currents of the transistors M106 and M107 are input to a differential current generation circuit 22 which includes a current mirror circuit. A current source 24 which outputs a constant current Id and a voltage buffer circuit 23 are connected to the output of the differential current generation circuit 22. The output of the voltage buffer circuit 23 is fed back as an input Vga to the potential difference generation circuit 21. As a result, a feedback circuit 31 is formed. The voltage Vga is input to the gate of a transistor M108 which operates as a voltage-current conversion circuit 25. The drain current of the transistor M108 is input to a current mirror circuit 26. The current mirror output is used as an output of each of the bias current sources 6, 7, 53, and 14 of the first to fourth embodiments. A reference character Cc shown in FIG. 11 indicates a stability compensation capacitance for ensuring the stability of the negative loop. Transistors M110, M111, and M112 are cascode transistors which are added to reduce differences between the drain voltages of the transistors M108, M106, and M107, respectively.

If the transistors M106 and M107 have the same transistor size, the drain currents (Ida and Idb) of the transistors M106 and M107 are represented by:

$$Ida = \frac{\beta n}{2} \cdot \left(Vga - Vtn + \frac{\Delta V}{2}\right)^2 \quad (26)$$

$$Idb = \frac{\beta n}{2} \cdot \left(Vga - Vtn - \frac{\Delta V}{2}\right)^2$$

where βn is the transconductance parameter of the N-channel transistor, and Vtn is the threshold voltage of the N-channel transistor. In the circuit of FIG. 11, feedback is applied to the voltage Vga so that the differential current ΔId between the drain currents Ida and Idb is equal to the constant source output current Id, and therefore, the following expression is established:

$$\Delta Id = Id \quad (27)$$

By using Expressions 26 and 27, the voltage Vga is represented by:

$$Vga = \frac{Id}{\beta n \cdot \Delta V} + Vtn \quad (28)$$

If the transistor M108 has the same transistor size as those of the transistors M106 and M107, a drain current Icnt0 is represented by the following expression by using Expression 28:

$$Icnt0 = \frac{\beta n}{2} \cdot (Vga - Vtn)^2 \quad (29)$$

$$= \frac{1}{2 \cdot \beta n} \cdot \left(\frac{Id}{\Delta V}\right)^2$$

If the mirror ratio of the current mirror circuit 26 of FIG. 11 is 1:1, Icnt6=Icnt0 and Icnt7=Icnt0. If these values are substituted into, for example, Expression 9, the gm of the N-channel transistor included in the current-mode filter circuit of the first embodiment is obtained in a form which does not include the transconductance parameter, as represented by:

$$gm1 = \sqrt{\frac{\beta 1}{\beta n}} \cdot \frac{Id}{\Delta V} = k1 \cdot \frac{Id}{\Delta V} \quad (30)$$

$$gm2 = \sqrt{\frac{\beta 2}{\beta n}} \cdot \frac{Id}{\Delta V} = k2 \cdot \frac{Id}{\Delta V}$$

$$gm3 = \sqrt{\frac{\beta 3}{\beta n}} \cdot \frac{Id}{\Delta V} = k3 \cdot \frac{Id}{\Delta V}$$

where k1, k2, and k3 are the transistor size ratios of the transistors M1, M2, and M3, respectively, of FIG. 1 to the transistor M106, M107, M108.

Therefore, the ω0, Q, and A0 of Expression 11 do not depend on the transconductance parameter, and can be arbitrarily controlled by changing Id and ΔV.

Figure 16:
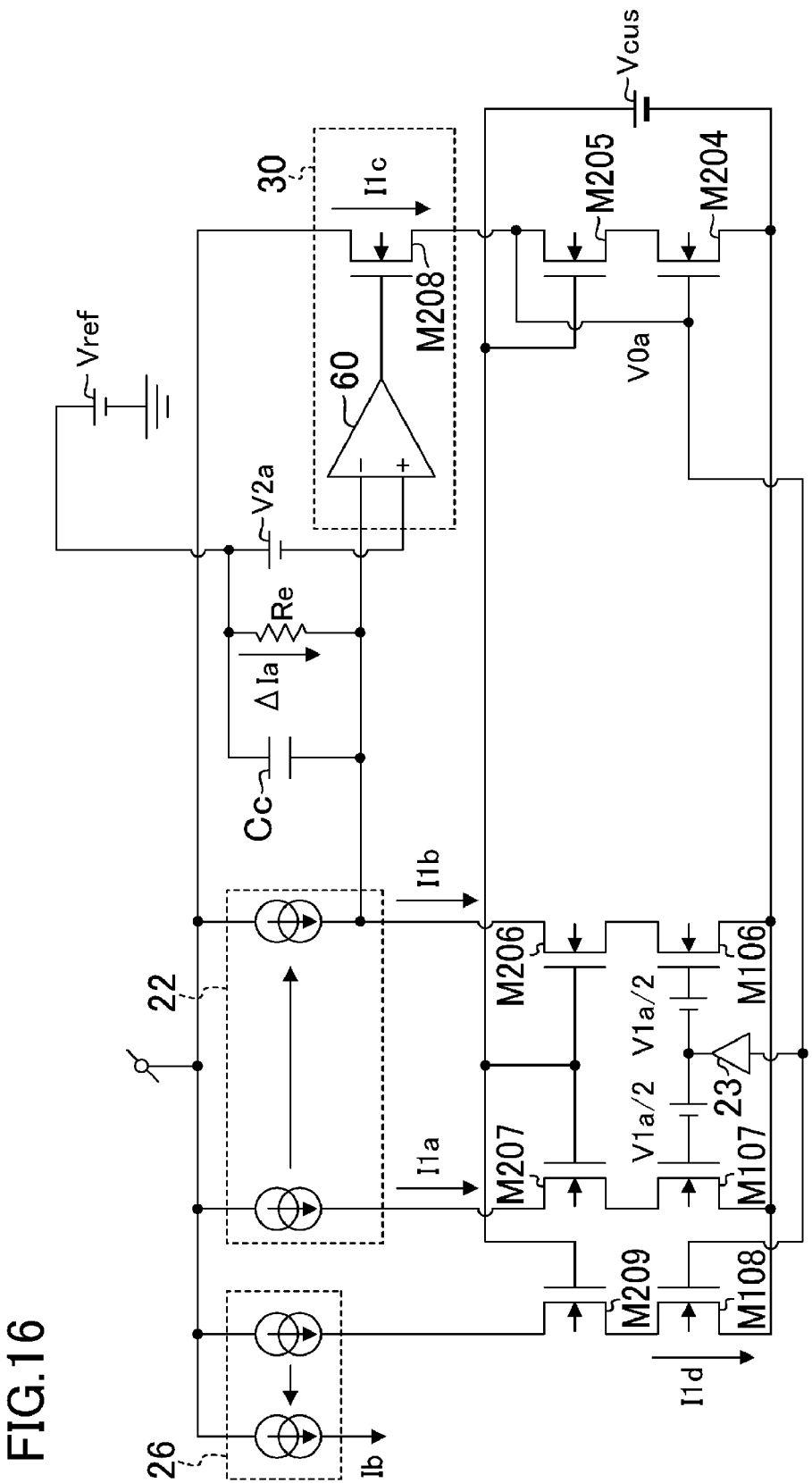
FIG. 16 is a diagram showing a conventional transconductance adjustment circuit included in the current-mode filter circuit of FIG. 15.

As described above, also in the transconductance adjustment circuit of FIG. 16, this advantage can be obtained. However, as can be seen from comparison between FIGS. 11 and 16, the operation amplifier 60, the resistance element Re, and the voltage sources V2a and Vref are not required in the circuit of FIG. 11, and therefore, a smaller number of parts can be used to provide the circuit of FIG. 11, and in addition, because the operation amplifier is not required, the circuit of FIG. 11 is suitable for low voltage operation. Thus, the circuit of FIG. 11 is advantageous over the conventional circuit of FIG. 16.

In the configuration of FIG. 11, if a bias voltage which allows each transistor to operate in its saturated region can be ensured, the voltage buffer circuit 23 can be removed, and the gate of the transistor M108 may be connected directly to the drain of the transistor M111.

Although FIG. 11 shows the example configurations of the bias current sources 6, 7, 53, and 14 of a filter circuit including N-channel transistors, the bias current source in the filter circuit including P-channel transistors of FIGS. 2 and 6 can be implemented by replacing the N-channel transistors of FIG. 11 with P-channel transistors.

Sixth Embodiment

Figure 12:
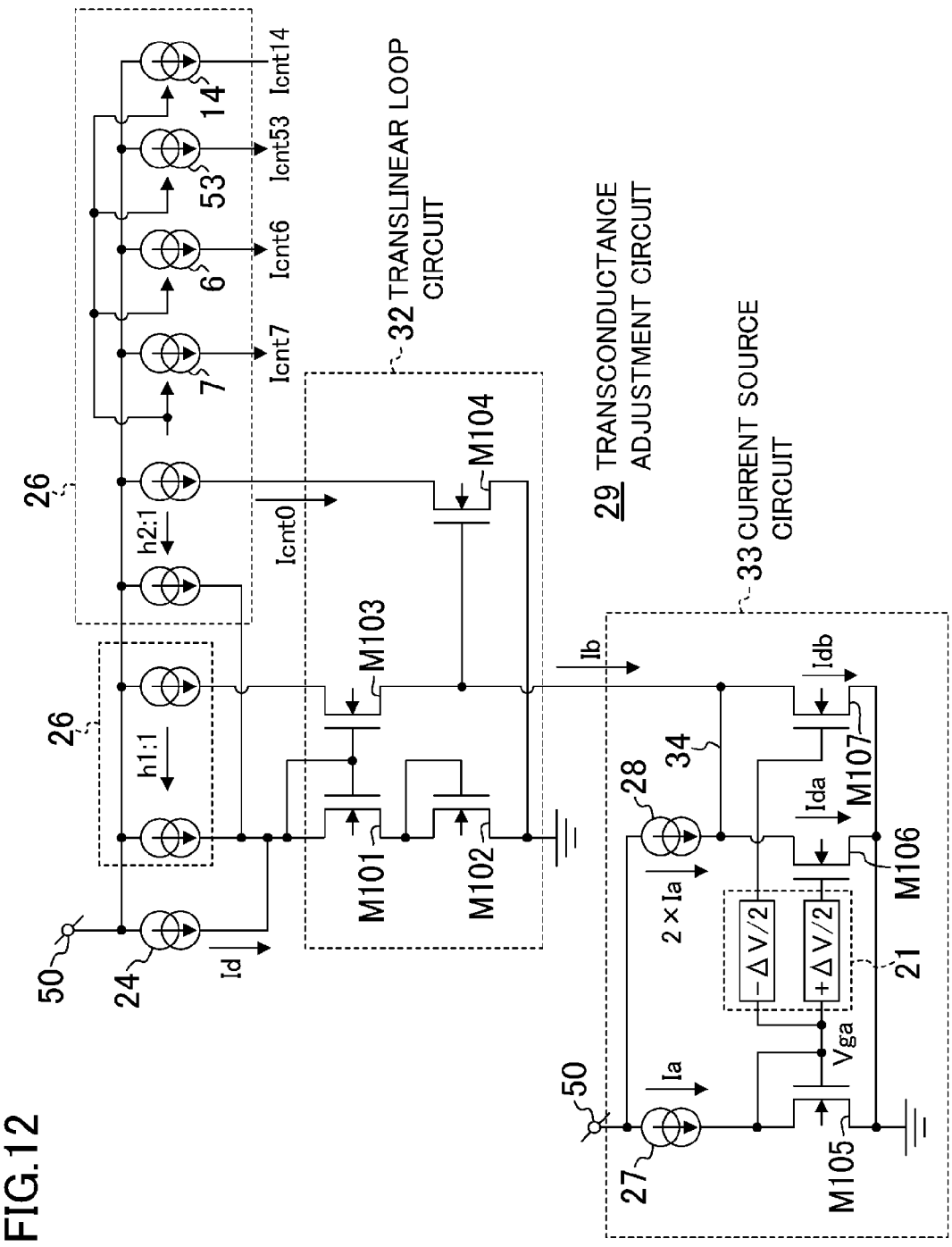
FIG. 12 is a diagram showing a transconductance adjustment circuit according to a sixth embodiment of the present disclosure.

FIG. 12 shows a sixth embodiment corresponding to claims 8 and 9.

FIG. 12 shows example configurations of the bias current sources 6, 7, 53, and 14 in the current-mode filter circuits of the first to fourth embodiments, which are formed by a transconductance adjustment circuit 29. A configuration and operation of the circuit will be described hereafter.

In FIG. 12, a fifth transistor M101, a sixth transistor M102, a seventh transistor M103, and an eighth transistor M104 which operate in their saturated regions form a translinear loop circuit 32. The fifth, sixth, seventh, and eighth transistors M101, M102, M103, and M104 are connected so that the drain currents of the transistors M103 and M104 are multiplied by h1 and h2, respectively, by a current mirror circuit (amplification section) 26, and the resulting outputs are added to the output current Id of a current source 24, and the resulting currents are used as bias currents for the transistors M101 and M102, respectively.

In a current source circuit 33 which supplies a bias current to the seventh transistor M103, a voltage Vga which is obtained by the output current Ia of a current source 27 being supplied to a diode-connected eleventh transistor M105 is input to a potential difference generation circuit 21, and the output voltages Vga+ΔV/2 and Vga−ΔV/2 of the potential difference generation circuit 21 are applied to the gates of a ninth transistor M106 and a tenth transistor M107, respectively, and the drain currents of the ninth and tenth transistors M106 and M107 are added together by an interconnect (addition section) 34. On the other hand, a current source (amplification section) 28 is configured so that a drain current Ia flowing through an eleventh transistor M105 is increased by a factor of two, the output current 2·Ia of the current source 28 is subtracted from the addition of the drain currents of the ninth and tenth transistors M106 and M107, and the resulting current is used as a bias current Ib for the seventh transistor M103. The current mirror output of the drain current of the eighth transistor M104 is used as the outputs of the bias current sources 6, 7, 53, and 14 of the first to fourth embodiments.

Here, if the transistors M101, M102, M103, and M104 have the same transistor size, currents flowing through these transistors have a relationship represented by:

$$2 \cdot \sqrt{Id + h1 \cdot Ib + h2 \cdot Icnt0} = \sqrt{Ib} + \sqrt{Icnt0} \quad (31)$$

Here, if h1=h2=0.25, the current Icnt0 is obtained from Expression 31:

$$Icnt0 = \frac{4}{Ib} \cdot Id^2 \quad (32)$$

If the transistors M106 and M107 have the same transistor size, the drain currents Ida and Idb of the transistors M106 and M107 are represented by:

$$Ida = \frac{\beta n}{2} \cdot \left(Vga - Vtn + \frac{\Delta V}{2}\right)^2 \quad (33)$$

$$Idb = \frac{\beta n}{2} \cdot \left(Vga - Vtn - \frac{\Delta V}{2}\right)^2$$

where βn is the transconductance parameter, and Vtn is the threshold voltage.

By using Expression 33, the addition output of the drain currents of the transistors M106 and M107 is represented by:

$$Ida + Idb = 2 \cdot \left(\frac{\beta n}{2}(Vga - Vtn)^2 + \frac{\beta n}{2}\left(\frac{\Delta V}{2}\right)^2\right) \quad (34)$$

$$= 2Ia + \beta n \cdot \left(\frac{\Delta V}{2}\right)^2$$

By using Ib=Ida+Idb−2Ia, the following expression is obtained:

$$Ib = \beta n \cdot \left(\frac{\Delta V}{2}\right)^2 \quad (35)$$

By substituting Expression 35 into Expression 32, the following expression is obtained:

$$Icnt0 = \frac{16}{\beta n} \cdot \left(\frac{Id}{\Delta V}\right)^2 \quad (36)$$

If the current mirror outputs Icnt6 and Icnt7 of the current Icnt0 of FIG. 12 are set so that Icnt6=Icnt0 and Icnt7=Icnt0, and these values are substituted into, for example, Expression 9, the gm of the N-channel transistor included in the current-mode filter circuit of the first embodiment is represented by the following expression which does not include the transconductance parameter:

$$gm1 = \sqrt{\frac{32 \cdot \beta 1}{\beta n}} \cdot \frac{Id}{\Delta V} = \sqrt{32} \cdot k1 \cdot \frac{Id}{\Delta V} \quad (37)$$

$$gm2 = \sqrt{\frac{32 \cdot \beta 2}{\beta n}} \cdot \frac{Id}{\Delta V} = \sqrt{32} \cdot k2 \cdot \frac{Id}{\Delta V}$$

$$gm3 = \sqrt{\frac{32 \cdot \beta 3}{\beta n}} \cdot \frac{Id}{\Delta V} = \sqrt{32} \cdot k3 \cdot \frac{Id}{\Delta V}$$

where k1, k2, and k3 are the transistor size ratios of the transistors M1, M2, and M3, respectively, of FIG. 1 to the transistor M106, M107.

Therefore, the ω0, Q, and A0 of Expression 11 do not depend on the transconductance parameter, and can be controlled by changing Id and ΔV.

The configuration of FIG. 12 does not include a negative loop in the circuit, compared to the configuration of the fifth embodiment of FIG. 11. Therefore, it is easy to design, and a capacitive element for stability compensation is not required, resulting in an advantageous reduction in the mounting area of the circuit.

Although FIG. 12 shows the example configurations of the bias current sources 6, 7, 53, and 14 of a filter circuit including N-channel transistors, the bias current source in the filter circuit including P-channel transistors of FIGS. 2 and 6 can be implemented by replacing the N-channel transistors of FIG. 11 with P-channel transistors.

Seventh Embodiment

Figure 13:
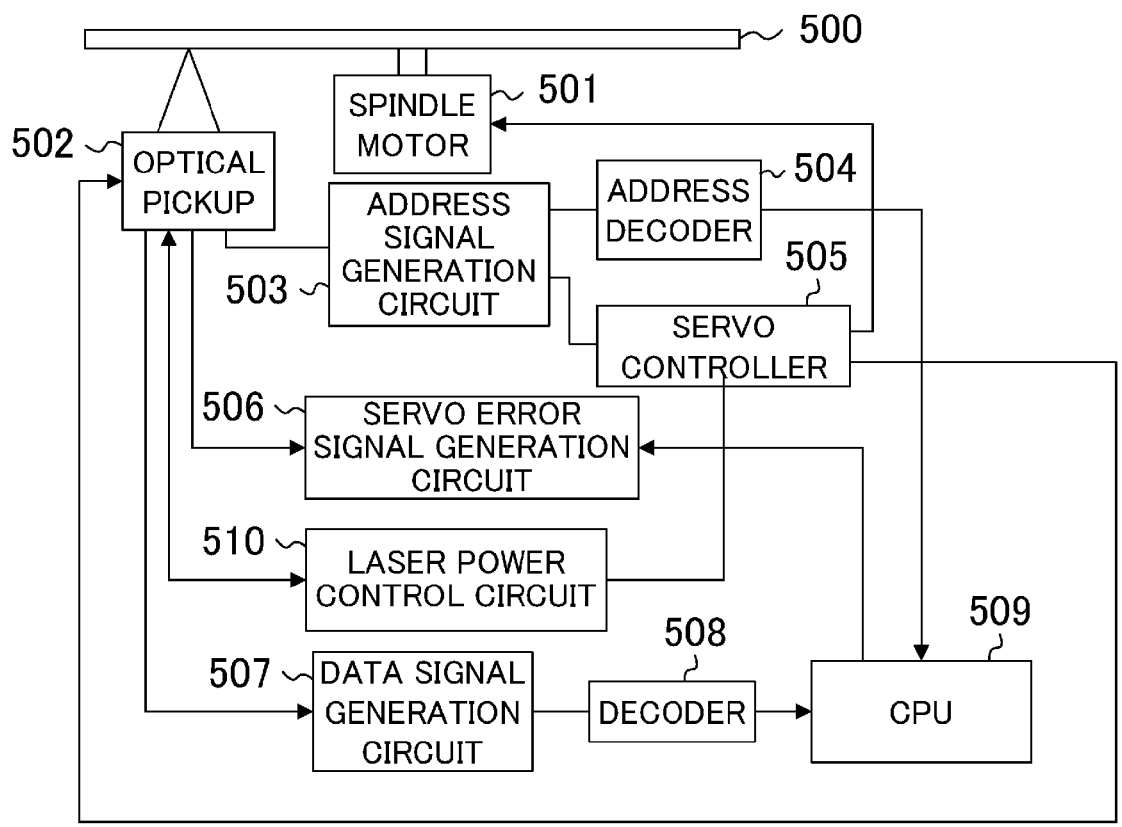
FIG. 13 is a diagram showing an example configuration of an optical disk device.

FIG. 13 shows an optical disk device according to a seventh embodiment.

In FIG. 13, the optical disk device includes a spindle motor 501, an optical pickup 502, an address signal generation circuit 503, an address decoder 504, a servo controller 505, a servo error signal generation circuit 506, a data signal generation circuit 507, a decoder 508, a CPU 509, and a laser power control circuit 510.

Here, as an application of the current-mode filter circuit of the present disclosure, the current-mode filter circuit of the present disclosure is applied to the data signal generation circuit 507 of FIG. 13. Alternatively, the current-mode filter circuit of the present disclosure is applicable to the address signal generation circuit 503, the servo error signal generation circuit 506, and the laser power control circuit 510.

Figure 14:
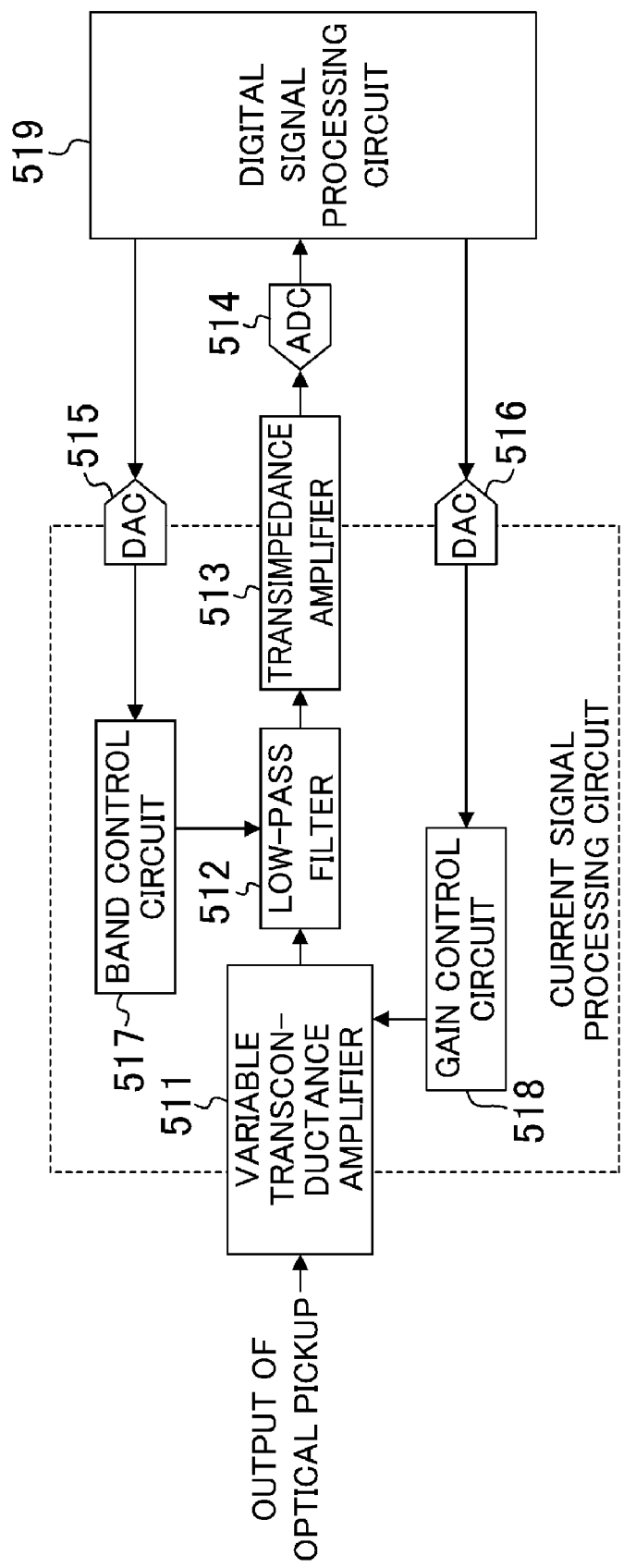
FIG. 14 is a diagram showing an example configuration of an analog front-end section of a data signal generation circuit included in the optical disk device of FIG. 13.
Figure 15:
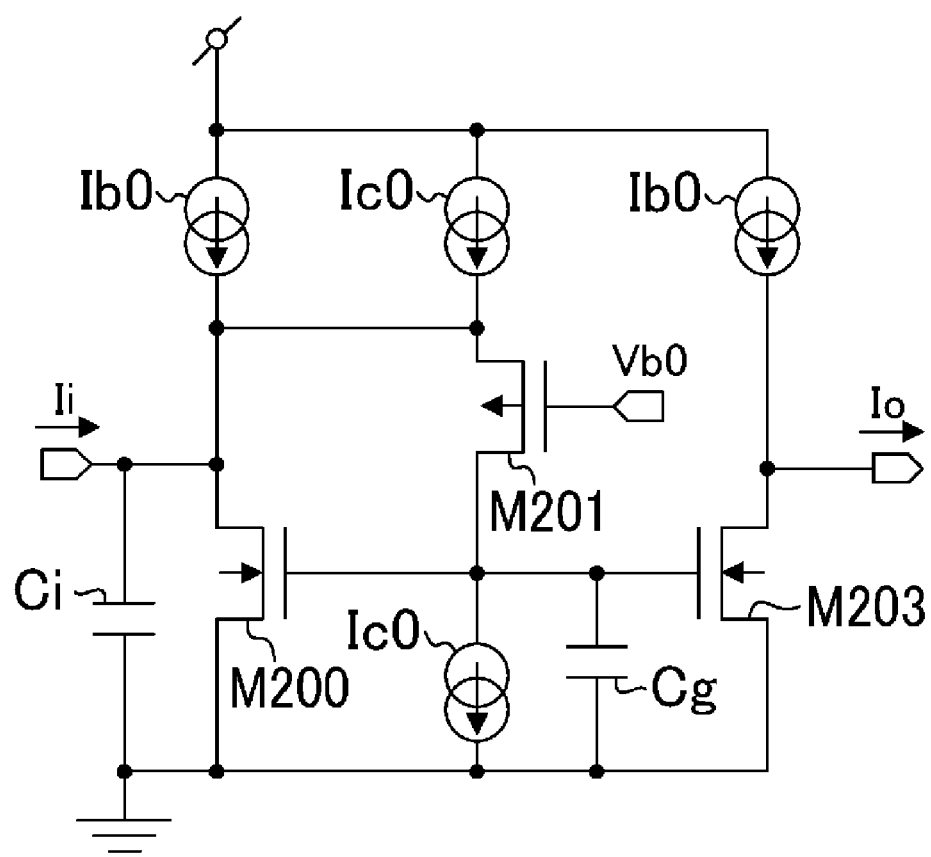
FIG. 15 is a diagram showing a conventional current-mode filter circuit.

An internal configuration of the data signal generation circuit 507, particularly an analog front-end section, is shown in FIG. 14. In FIG. 14, a data signal obtained from an optical disk 500 needs to be processed by the analog front-end section. Specifically, the amplitude of the data signal is normalized to match the full-scale input D range of an A/D converter 514, and noise is removed for prevention of aliasing. Therefore, in the signal processing path, as shown in FIG. 14, a variable transconductance amplifier 511, a low-pass filter 512 of the present disclosure, and a transimpedance amplifier 513 are provided upstream of the A/D converter 514. The variable transconductance amplifier 511 has a function of converting a voltage signal input from the optical pickup 502 into a current signal. The transconductance of the variable transconductance amplifier 511 is controlled via a D/A converter 516 and a gain control circuit 518, depending on a signal amplitude value detected by a digital signal processing circuit 519, thereby normalizing the output current amplitude.

The cut-off frequency of the low-pass filter 512 of the present disclosure is controlled by the digital signal processing circuit 519 via a D/A converter 515 and a band control circuit 517 so that optimum noise removal can be invariably performed, depending on the medium type or reproduction speed of the optical disk 500.

The output current signal of the low-pass filter 512 of the present disclosure is converted into a voltage signal by the transimpedance amplifier 513, and the voltage signal is input to the A/D converter 514. If the D/A converters 515 and 516 are current steering D/A converters, and the gain control circuit 518 and the band control circuit 517 are implemented by current signal processing performed by the current mirror circuit, all analog signal processing can be implemented in the current mode, except for parts which require transfer of a voltage signal to and from the input and output sections of the analog front-end section. Therefore, the analog circuit which conventionally requires a power source voltage of about 3 V can be implemented by a low power source voltage of, for example, about 1.5 V. In this case, the power consumption of the analog front-end can be reduced by about 50%.

As described above, the current-mode filter circuit of the present disclosure is applicable to all fields of products including analog filter circuits, including, of course, filter circuits in optical disk devices, such as Blu-ray Discs, DVDs, etc.

What is claimed is:

1. A filter circuit comprising:
a current mirror circuit including:
a first transistor, a second transistor, and a third transistor having a same channel polarity, a drain of the first transistor being connected to a source of the second transistor, a drain of the second transistor being connected to a gate of the first transistor and a gate of the third transistor;
a first capacitive element having a first end connected to the gate of the first transistor and a second end connected to a fixed potential; and
a second capacitive element having a first end connected to the drain of the first transistor and a second end connected to the fixed potential;
a first bias current supplying circuit configured to supply a bias current to each of the first and second transistors;
an input terminal connected to at least one of the drain and the gate of the first transistor; and
an output terminal configured to extract a signal from a drain current of the third transistor.

2. The filter circuit of claim 1, wherein the bias currents supplied to the first and second transistors are variable.

3. The filter circuit of claim 2, wherein:
the variable bias currents are supplied from a transconductance adjustment circuit,
the transconductance adjustment circuit includes:
a ninth transistor and a tenth transistor whose sources are connected together;
a potential difference generation circuit configured to generate a potential difference between gates of the ninth and tenth transistors;
a differential current generation circuit configured to output a difference between drain currents of the ninth and tenth transistors;
a feedback section configured to generate a control voltage so that an output current value of the differential current generation circuit matches an output current value of a reference current source, and feed the control voltage back to the gates of the ninth and tenth transistors; and
a voltage-to-current converter configured to convert the feedback voltage into a current, and
the bias currents supplied to the first and second transistors are each supplied as a current mirror output of an output of the voltage-to-current converter.

4. The filter circuit of claim 2, wherein:
the variable bias currents are supplied from a transconductance adjustment circuit,
the transconductance adjustment circuit includes:
a translinear loop circuit including a fifth transistor, a sixth transistor, a seventh transistor, and an eighth transistor;
an amplification section configured to multiply a current flowing through each of the seventh and eighth transistors by a predetermined factor, and supply the resulting currents to the fifth and sixth transistors; and
a current source circuit configured to supply a bias current to the seventh transistor; and a current mirror output of a current flowing through the eighth transistor is used as a bias current for the first, second, or third transistor.

5. The filter circuit of claim 4, wherein:
the current source circuit configured to supply a bias current to the seventh transistor, includes:
a ninth transistor and a tenth transistor whose sources are connected together;
a potential difference generation circuit configured to generate a potential difference between gates of the ninth and tenth transistors, and apply an average voltage of gate voltages of the ninth and tenth transistors to a gate of an eleventh transistor;
an addition section configured to add up drain currents flowing through the ninth and tenth transistors; and
an amplification section configured to multiply a drain current flowing through the eleventh transistor by a factor of two, and
a current obtained by subtracting the current obtained by multiplying the drain current flowing through the eleventh transistor by a factor of two from the addition value of the drain currents of the ninth and tenth transistors, is used as a bias current for the first or second transistor.

6. An optical disk device comprising:
the filter circuit of claim 1 in a signal processing path.

7. The filter circuit of claim 1, further comprising a second bias current supplying circuit configured to supply a bias current to the third transistor.

8. The filter circuit of claim 1, wherein a gate of the second transistor is configured to receive a constant voltage so that the gate of the second transistor is grounded for alternating current.

9. A filter circuit comprising:
a current mirror circuit including:
a first transistor, a second transistor, a third transistor, and a fourth transistor having a same channel polarity, a drain of the first transistor being connected to a gate of the second transistor, a source of the second transistor being connected to a gate of the first transistor and a gate of the third transistor;
a first capacitive element having a first end connected to the drain of the first transistor and a second end connected to a gate and a drain of the fourth transistor;
a second capacitive element having a first end connected to the gate of the second transistor and a second end connected to a fixed potential;
a first bias current supplying circuit configured to supply a bias current to the first transistor;
a second bias current supplying circuit configured to supply a bias current to the fourth transistor;
an input terminal connected to the drain of the fourth transistor; and
an output terminal configured to extract a signal from a drain current of the third transistor,
wherein the fourth transistor operates as an I/V converter which converts an input current signal into a voltage signal.

10. The filter circuit of claim 9, wherein the bias currents supplied to the first and fourth transistors are variable.

11. The filter circuit of claim 10, wherein:
the variable bias currents are supplied from a transconductance adjustment circuit,
the transconductance adjustment circuit includes:
a ninth transistor and a tenth transistor whose sources are connected together;
a potential difference generation circuit configured to generate a potential difference between gates of the ninth and tenth transistors;
a differential current generation circuit configured to output a difference between drain currents of the ninth and tenth transistors;
a feedback section configured to generate a control voltage so that an output current value of the differential current generation circuit matches an output current value of a reference current source, and feed the control voltage back to the gates of the ninth and tenth transistors; and
a voltage-to-current converter configured to convert the feedback voltage into a current, and
the bias currents supplied to the first and fourth transistors are each supplied as a current mirror output of an output of the voltage-to-current converter.

12. The filter circuit of claim 10, wherein:
the variable bias currents are supplied from a transconductance adjustment circuit,
the transconductance adjustment circuit includes:
a translinear loop circuit including a fifth transistor, a sixth transistor, a seventh transistor, and an eighth transistor;
an amplification section configured to multiply a current flowing through each of the seventh and eighth transistors by a predetermined factor, and supply the resulting currents to the fifth and sixth transistors; and
a current source circuit configured to supply a bias current to the seventh transistor, and
a current mirror output of a current flowing through the eighth transistor is used as a bias current for the first and fourth transistors.

13. The filter circuit of claim 12, wherein:
the current source circuit configured to supply a bias current to the seventh transistor, includes:
a ninth transistor and a tenth transistor whose sources are connected together;
a potential difference generation circuit configured to generate a potential difference between gates of the ninth and tenth transistors, and apply an average voltage of gate voltages of the ninth and tenth transistors to a gate of an eleventh transistor;
an addition section configured to add up drain currents flowing through the ninth and tenth transistors; and
an amplification section configured to multiply a drain current flowing through the eleventh transistor by a factor of two, and
a current obtained by subtracting the current obtained by multiplying the drain current flowing through the eleventh transistor by a factor of two from the addition value of the drain currents of the ninth and tenth transistors, is used as a bias current for the first and fourth transistors.

14. An optical disk device comprising:
the filter circuit of claim 9 in a signal processing path.

15. The filter circuit of claim 9, further comprising a third bias current supplying circuit configured to supply a bias current to the third transistor.

16. A filter circuit comprising:
a current mirror circuit including:
a first transistor, a second transistor, and a third transistor having a same channel polarity, a drain of the first transistor being connected to a gate of the second transistor, a source of the second transistor being connected to a gate of the first transistor and a gate of the third transistor;

a first capacitive element having a first end connected to the drain of the first transistor and a second end connected to a fixed potential;

a second capacitive element having a first end connected to the gate of the first transistor and a second end connected to the fixed potential a first bias current supplying circuit configured to supply a bias current to the first transistor;

an input terminal connected to at least one of the drain and the gate of the first transistor; and an output terminal configured to extract a signal from a drain current of the third transistor.

17. The filter circuit of claim 16, further comprising a second bias current supplying circuit configured to supply a bias current to the third transistor.

18. A filter circuit comprising:

a current mirror circuit including:

a first transistor, a second transistor, a third transistor, and a fourth transistor having a same channel polarity, a drain of the first transistor being connected to a gate of the second transistor, a source of the second transistor being connected to a gate of the first transistor and a gate of the third transistor;

a first capacitive element having a first end connected to the drain of the first transistor and a second end connected to a fixed potential;

a second capacitive element having a first end connected to the gate of the second transistor and a second end connected to a gate and a drain of the fourth transistor;

a first bias current supplying circuit configured to supply a bias current to the first transistor;

a second bias current supplying circuit configured to supply a bias current to the fourth transistor;

an input terminal connected to the drain of the fourth transistor; and an output terminal configured to extract a signal from a drain current of the third transistor.

* * * * *